United States Patent [19]

Gambini

[11] Patent Number: 5,673,141
[45] Date of Patent: Sep. 30, 1997

[54] OPTICAL AMPLIFIER

[75] Inventor: Piero Gambini, Turin, Italy

[73] Assignee: Cselt—Centro Studi e Laboratori Telecommunicazioni S.p.A., Turin, Italy

[21] Appl. No.: 528,757

[22] Filed: Sep. 15, 1995

[30] Foreign Application Priority Data

Dec. 15, 1994 [IT] Italy .................... TO94A1019

[51] Int. Cl.⁶ .................... G02B 6/26; H01S 3/091
[52] U.S. Cl. .................... 359/341; 359/133; 359/344
[58] Field of Search .................... 359/133, 134, 359/160, 341, 344.5; 372/75

[56] References Cited

U.S. PATENT DOCUMENTS

| | | | |
|---|---|---|---|
| 5,039,199 | 8/1991 | Mollenauer et al. | 359/334 |
| 5,224,116 | 6/1993 | Whitley et al. | 372/6 |
| 5,239,607 | 8/1993 | de Silva et al. | 385/122 |
| 5,355,248 | 10/1994 | Hadjifotiou | 359/341 |
| 5,436,759 | 7/1995 | Dijaili et al. | 359/333 |

OTHER PUBLICATIONS

G.Soulage et al; "Clamped Gain Travelling Wave Semiconductor Optical Amplifier as a Large Dynamic Range Optical Gate"; ECOC'94, Conference, Florence,Italy25 Sep.94; pp. 451–454.

Doussiere et al, 14th IEEE Intern. Semiconduct. Laser Conf., Sep. 19, 1994, pp. 185–186; abst. only herewith.

Lablonde et al, 20th European Conf. on Semiconduc. Opt. Amp., Sep. 25, 1994, pp. 715–718, vol. 2; abst. only herewith.

*Primary Examiner*—Nelson Moskowitz
*Attorney, Agent, or Firm*—Herbert Dubno

[57] ABSTRACT

The amplifier is made up of two active or guide amplifiers placed respectively before and after a gain clamped semiconductor amplifier brought to stimulated emission conditions, which acts as pump radiation source for the two active fiber or guide amplifiers.

5 Claims, 2 Drawing Sheets

OPTICAL AMPLIFIER

FIELD OF THE INVENTION

The present invention relates to optical communications systems and, more particularly, to an optical amplifier for use in such systems.

BACKGROUND OF THE INVENTION

In optical communications systems, two types of optical amplifiers are generally used, namely semiconductor amplifiers or active optical fiber (or, in general, active optical guide) amplifiers.

Semiconductor amplifiers are devices of a structure essentially analogous to that of lasers and which are biased below the stimulated emission threshold to avoid starting of laser oscillations, and above transparency, to exploit the amplification characteristics of the active material of which they are composed of. A problem presented by semiconductor amplifiers is represented by the relatively high intermodulation level, which is a hindrance to their use in wavelength division multiplexing communication systems.

Fiber amplifiers utilize a length of an active optical fiber (or of an active integrated optical guide), i.e. a fiber or guide in which the core is doped with ions with spectroscopic emission bands in the regions of interest for telecommunications, in particular rare earth ions such as neodymium or praseodymium (for systems operating in the so-called second window, around 1.3 µm) and erbium (for the third window, around 1.55 µm). Amplification is obtained by launching into the core a pump radiation of suitable wavelength, different from that of the signal to be amplified. The main problem encountered when using these amplifiers is the need to employ dichroic couplers to send the signal to be amplified and the pump signal into the fiber or guide. These couplers are difficult to integrate and are quite expensive. Furthermore, the amplifier switching on and off times, which depend on the fluorescence time of the reactants, are relatively long (of the order of some milliseconds for erbium).

Recently, semiconductor amplifiers have also been proposed which have a low intermodulation level, so that they can be usefully employed with wavelength division multiplexing systems. An amplifier of this kind is described by G. Soulage et al. in the paper "Clamped gain travelling wave semiconductor optical amplifier as a large dynamic range optical gate", presented at the ECOC'94 Conference, Florence, Italy, 25–29 Sep. 1994. The device is composed essentially of a distributed-feedback laser diode which, when brought to stimulated emission conditions, is capable of amplifying wavelengths in the third window. The device has a gain that is constant for a wide range of input signal powers (at wavelengths other than the Bragg wavelength) and does not depend on the input signal polarization.

This device, however, has the drawback that the power emitted because of the laser effect is not exploited; moreover, like all semiconductor amplifiers, it is relatively noisy.

OBJECT OF THE INVENTION

It is an object of the invention to provide an optical amplifier that has high performance and low noise and that does not require dichroic coupling devices.

SUMMARY OF THE INVENTION

The amplifier according to the invention comprises:

an input stage comprising a first active optical guide amplifier;

an output stage comprising a second active optical guide amplifier; and an intermediate stage, comprising a semiconductor amplifier which: is associated with means for producing a gain clamping; is capable of emitting a radiation having a different wavelength from that of an optical signal to be amplified and lying in a band corresponding to the pump band of the active optical guide amplifiers; is biased by a current bringing it to emission conditions; and is coupled to the guides forming the input and output stages in such a way as to send into them, as pump radiation, the radiation emitted through stimulated emission.

Gain clamping may be obtained by means of a grating made within the semiconductor amplifier, which therefore is essentially a distributed-feedback laser, or by means of two optical fiber gratings, connected to opposite sides of the semiconductor amplifier and partially reflecting radiation at the semiconductor amplifier stimulated emission wavelength.

The invention meets the requirements indicated above. The gain clamped amplifier is less expensive than dichroic couplers and its use as the source of the pump radiation makes the structure both simple and compact. Moreover, the noise introduced by the semiconductor amplifier is added to a signal that has already been amplified by the input stage (which, being a fiber or integrated optical amplifier, is not very noisy in itself), and therefore its influence is lessened. Also, switch-off characteristics no longer depend on the reactant fluorescence time, but on the semiconductor amplifier, which is controlled by a current and thus has much shorter switch-off times (of the order of a nanosecond). Finally, the amplifier output power is essentially constant, since on the one hand the semiconductor amplifier gain is essentially constant for a wide range of input powers, and on the other the intensity of the input/output amplifier pump radiation (i.e. of the semiconductor amplifier emission) essentially varies in a way that is inversely proportional to the intensity of the radiation arriving at the semiconductor amplifier.

BRIEF DESCRIPTION OF THE DRAWINGS

The above and other objects, features, and advantages will become more readily apparent from the following description, reference being made to the accompanying drawing in which.

SPECIFIC DESCRIPTION

Figure 1:
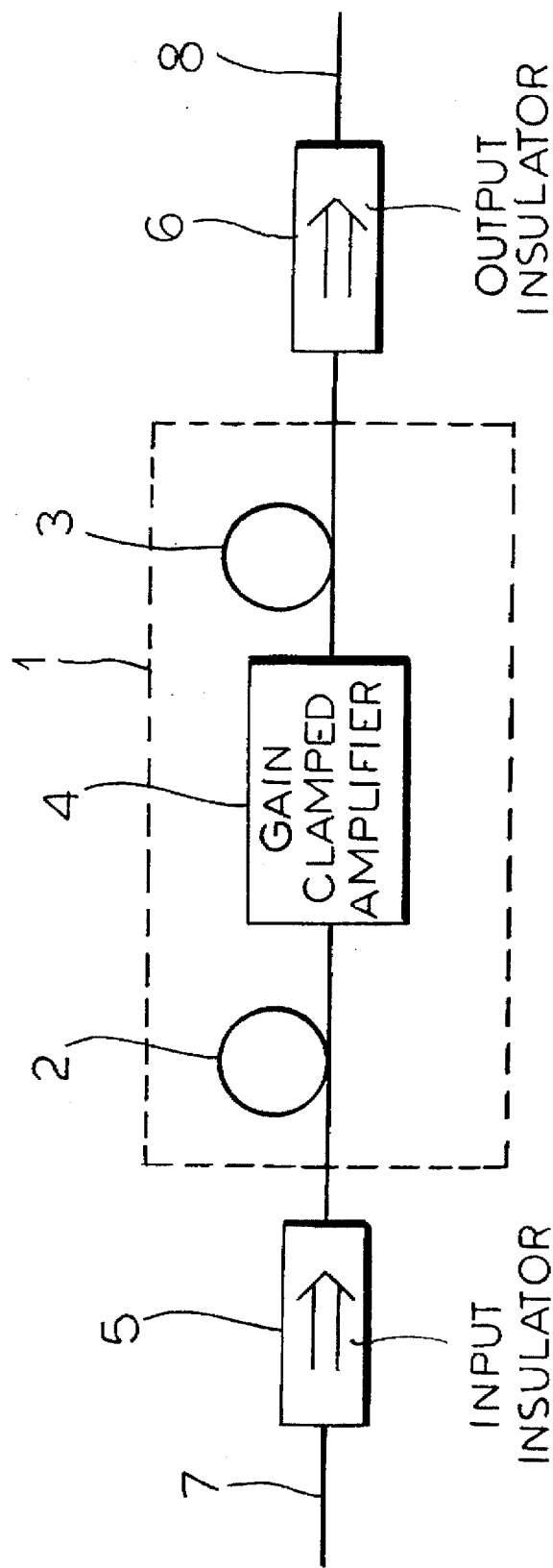
FIG. 1 is a schematic diagram of the amplifier according to the invention.

In FIG. 1, the amplifier according to the invention, indicated by dashed-line block 1, comprises an input stage 2 and an output stage 3, which in the illustrated example are each made up by a section of optical fiber doped with rare earth ions (in particular Er ions, if the signal to be amplified has a wavelength within the third window, or Nd or Pr ions if the signal to be amplified has a wavelength within the second window), and an intermediate stage 4 comprising a gain clamped semiconductor amplifier, to which the fibers making up amplifiers 2 and 3 are joined. Semiconductor amplifier 4 is biased by a current such that it is brought to laser emission conditions, so that it acts as a pump radiation source for amplifiers 2, 3. Amplifier 2 shall be pumped in reverse direction with respect to the signal to be amplified, while in amplifier 3 the signal and the pump radiation propagate in the same direction.

The fibers that make up amplifiers 2, 3 are joined to amplifier 4 in a wholly conventional manner. By means of optional input and output insulators 5, 6, amplifier 1 is connected to two fiber sections 7, 8 which convey the signals to be amplified and respectively the amplified signals.

Figure 2:
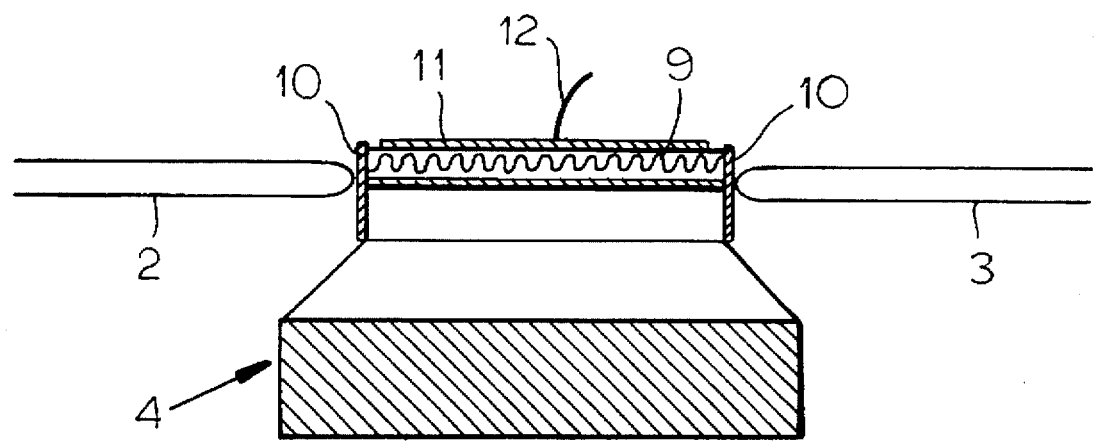
FIG. 2 is a diagram of a gain clamped semiconductor amplifier; for use in the system of FIG.1

Gain clamped semiconductor amplifier 4 may be for instance an amplifier like that described in the paper by G. Soulage et al, which is shown schematically in FIG. 2. Amplifier 4 is essentially a distributed feedback semiconductor laser, in which the optical feedback is obtained by means of a grating 9. The terminal facets are equipped with anti-reflection coatings 10 to suppress Fabry-Perot resonances. The electrode and the conductor for connection to the bias current source are indicated at references 11, 12.

Considering by way of example the case in which the signals to be amplified have a wavelength within the third window (1.55 μm), so that amplifiers 2, 3 are realized with erbium doped fibers, amplifier 4 will be designed to amplify signals whose wavelength is, for instance, between 1.53 μm and 1.56 μm and to emit a radiation within the pump band of erbium (1.48 μm). The skilled worker in the art will have no difficulty in designing the grating in such a way as to obtain the desired values.

With the set-up described above, the signal to be amplified (e.g. a wavelength division multiplex signal), undergoes three successive amplifications and therefore good performance is obtained. Values of the order of ten dB for the input and the semiconductor amplifiers, and of the order of 5 dB for the output amplifier are easily obtainable. Semiconductor amplifier 4, as stated above, has an essentially constant gain, which does not depend on input power. On the contrary, the power emitted due to laser action, and therefore the fiber amplifier pump power, decreases as the input power increases, thus causing the fiber amplifier gain to decrease. However, on the whole output power remains essentially constant.

To obtain amplification values like those stated above for fiber amplifiers, fiber lengths of the order of about ten meters will be sufficient. Therefore the device, including the insulators, can be mounted in a module of reduced size (a few centimeters on each side).

Figure 3:
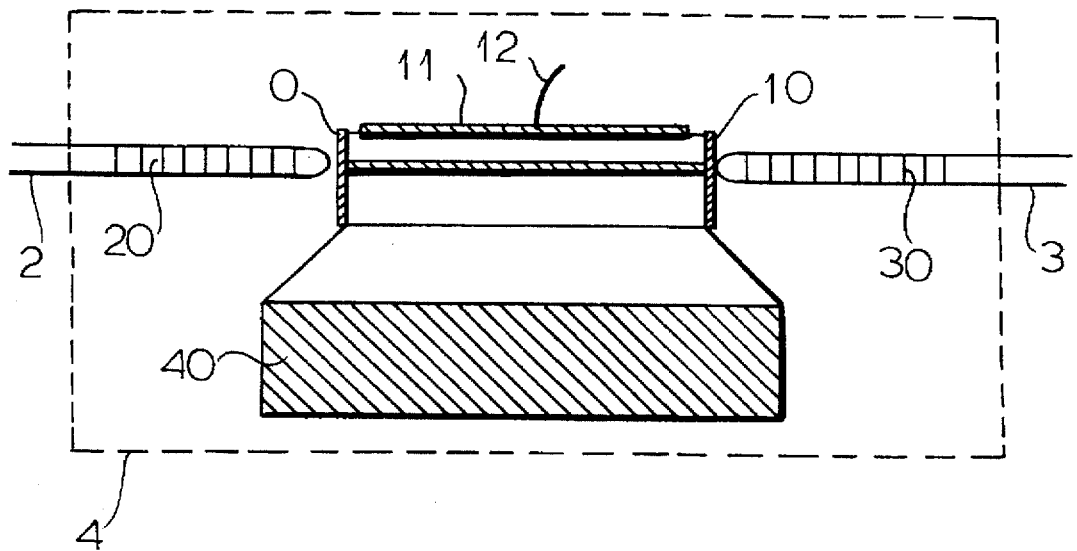
FIG. 3 is a schematic representation of a variant embodiment.

In the embodiment shown in FIG. 3, gain clamped semiconductor amplifier 4 comprises a conventional semiconductor amplifier 40 connected to a pair of optical fiber gratings 20, 30 capable of partially reflecting the wavelength (e.g. again 1.48 μm) emitted by amplifier 40, thereby realizing a cavity effect. Reflection must be only partial, as part of the radiation emitted by amplifier 40 is to pump optical fiber amplifiers 2, 3. Gratings 20, 30 may be formed in the end portions of fibers 2, 3, as shown in the drawing, or may be formed into sections of conventional fibers which are then joined to fibers 2, 3.

It is evident that what has been describe above has been given by way of non-limiting example and that variations and modifications are possible without departing from the scope of the invention. In particular, the input and output stages may be realized by means of integrated optical guides of the active type. These, too, can easily be coupled with a semiconductor amplifier.

I claim:

1. An optical amplifier comprising:

an input stage comprised of a first active optical guide amplifier having input end and an output end;

an output stage comprised of a second active optical guide amplifier having an input and end and an output end; and an intermediate stage comprised of a semiconductor amplifier provided for gain clamping, and having an input side connected to said output end of said first active optical guide amplifier and an output side connected to said input end of said second active optical guide amplifier, said semiconductor amplifier being in line with said active optical guide amplifiers and being by stimulated emission, a radiation at a wavelength other than that of an optical signal to be amplified and lying in a pump band of the active guide amplifiers, said semiconductor amplifier being biased by a current such that said semiconductor amplifier is brought to stimulated emission conditions, and said semiconductor amplifier being coupled to the guide amplifiers making up the input and output stages so as to send into said guide amplifiers, as pump radiation, radiation emitted by stimulated emission by said semiconductor amplifier.

2. The optical amplifier according to claim 1, wherein the means for a gain clamping comprise a grating made within the semiconductor amplifier.

3. The optical amplifier according to claim 1, wherein the means for a gain clamping comprise a pair of optical fiber gratings connected to the semiconductor amplifier and arranged to partially reflect the radiation emitted by the semiconductor amplifier by stimulated emission.

4. The optical amplifier according to claim 3, wherein the optical fiber gratings are made within the end portions of active optical fibers forming the input and output stages (2, 3).

5. The optical amplifier according to claim 1 further comprising an input insulator and an output insulator for connection of the input and output stages to optical transmission lines which respectively convey the signals to be amplified and the amplified signals.

* * * * *